US010685736B2

(12) United States Patent
Berke et al.

(10) Patent No.: US 10,685,736 B2
(45) Date of Patent: Jun. 16, 2020

(54) MAINTAINING HIGHEST PERFORMANCE OF DDR5 CHANNEL WITH MARGINAL SIGNAL INTEGRITY

(71) Applicant: DELL PRODUCTS, L.P., Round Rock, TX (US)

(72) Inventors: Stuart A. Berke, Austin, TX (US); Vadhiraj Sankaranarayanan, Austin, TX (US); Bhyrav M. Mutnury, Austin, TX (US)

(73) Assignee: Dell Products, L.P., Round Rock, TX (US)

(*) Notice: Subject to any disclaimer, the term of this patent is extended or adjusted under 35 U.S.C. 154(b) by 41 days.

(21) Appl. No.: 16/044,278

(22) Filed: Jul. 24, 2018

(65) Prior Publication Data

US 2020/0035321 A1 Jan. 30, 2020

(51) Int. Cl.
| | | |
|---|---|---|
| *G11C 29/00* | (2006.01) | |
| *G06F 11/22* | (2006.01) | |
| *G11C 29/42* | (2006.01) | |
| *G11C 29/06* | (2006.01) | |
| *G06F 11/10* | (2006.01) | |
| G11C 29/04 | (2006.01) | |
| G11C 29/12 | (2006.01) | |

(52) U.S. Cl.
CPC ........ *G11C 29/846* (2013.01); *G06F 11/1016* (2013.01); *G06F 11/1044* (2013.01); *G06F 11/221* (2013.01); *G11C 29/06* (2013.01); *G11C 29/42* (2013.01); *G11C 2029/0407* (2013.01); *G11C 2029/1204* (2013.01)

(58) Field of Classification Search
CPC ...... G11C 29/846; G11C 29/42; G06F 11/221
See application file for complete search history.

(56) References Cited

U.S. PATENT DOCUMENTS

| | | | | |
|---|---|---|---|---|
| 5,768,291 A | * | 6/1998 | Kelton | .................. H04L 1/0057 375/331 |
| 5,978,953 A | * | 11/1999 | Olarig | ................. G06F 11/1016 714/758 |
| 8,484,383 B2 | * | 7/2013 | Hartwich | ................ H04L 49/90 709/250 |
| 8,639,964 B2 | | 1/2014 | Berke et al. | |
| 8,811,065 B2 | | 8/2014 | Rajan et al. | |
| 9,471,231 B2 | | 10/2016 | Bollandoor et al. | |

(Continued)

OTHER PUBLICATIONS

Li, Qingsong, et al., "Enabling Memory Reliability, Availability, and Serviceability Features on Dell PowerEdge Servers", Dell Power Solutions, Aug. 2005.

*Primary Examiner* — Joseph D Torres
(74) *Attorney, Agent, or Firm* — Isidore PLLC

(57) ABSTRACT

A memory subsystem includes one or more communication channels that enable communication with more than one memory module of an information handling system (IHS). A memory controller of the memory subsystem is in communication with the one or more communication channels. In response to determining that one or more lines fail signal integrity testing at a target communication speed, the memory controller invokes an error checking and correcting (ECC) mode that reassigns lines of the communication channel for carrying data and ECC code. Lines that passed signal integrity testing are assigned to carrying data and ECC code. Lines that failed signal integrity testing are not used.

15 Claims, 6 Drawing Sheets

(56) References Cited

U.S. PATENT DOCUMENTS

| | | |
|---|---|---|
| 9,645,746 B2 | 5/2017 | Berke et al. |
| 9,825,730 B1 | 11/2017 | Berke et al. |
| 9,880,754 B2 | 1/2018 | Berke |
| 2004/0153911 A1* | 8/2004 | Regev .................... G11C 15/00 714/718 |
| 2005/0076273 A1* | 4/2005 | Mantri ................... G11C 15/00 714/718 |
| 2006/0181942 A1* | 8/2006 | Cordero ................. G06F 11/10 365/200 |
| 2010/0083037 A1* | 4/2010 | Oberlaender .......... G11C 29/44 714/5.1 |
| 2013/0159761 A1* | 6/2013 | Baumgartner ............ H04L 1/22 714/4.5 |
| 2017/0060681 A1* | 3/2017 | Halbert ............... G06F 11/1068 |

* cited by examiner

MAINTAINING HIGHEST PERFORMANCE OF DDR5 CHANNEL WITH MARGINAL SIGNAL INTEGRITY

BACKGROUND

1. Technical Field

The present disclosure relates in general to reliability, availability, and serviceability (RAS) features in double data rate channel in an information handling system (IHS), and more particularly to error checking and correcting (ECC) code for RAS in fifth generation double data rate (DDR5) communication channels to memory modules of an IHS.

2. Description of the Related Art

As the value and use of information continue to increase, individuals and businesses seek additional ways to process and store information. One option available to users is information handling systems (IHSs). An IHS generally processes, compiles, stores, and/or communicates information or data for business, personal, or other purposes, thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

IHSs such as enterprise servers are designed with reliability, availability, and serviceability (RAS) features to enable maximum system uptime for mission-critical applications by helping to safeguard servers against certain types of memory errors. Memory channels that communicate with system memory modules include lines for error checking and correcting (ECC) code as well as data to support RAS. A host can utilize ECC-capable memory to detect and correct single-bit data errors and can detect double-bit data errors with a small number of lines for ECC code. With sufficient number of lines for ECC code, additional correction can be achieved such as double error correction. When the number of errors in the channel is too great to handle with ECC code, generally-known memory system modules must either operate at a lower transfer speed or not be used. Both conventional options lower available memory resources.

BRIEF SUMMARY

In accordance with the teachings of the present disclosure, a method begins with testing, by a memory controller, signal integrity of each line of a communication channel to a memory module. The communication channel has a number of lines that meets or exceeds a specified number of lines required for data and error checking and correcting (ECC) code by a processor subsystem of an information handling system (IHS). The testing is performed at a target communication speed. The method includes determining whether one or more lines of the communication channel fails the signal integrity test at the target communication speed. In response to determining that one or more lines of the communication channel fails the signal integrity test at the target communication speed, the method includes invoking an ECC mode that reassigns lines of the communication channel. Lines that passed signal integrity testing are assigned to carrying data and ECC code. Lines that failed signal integrity testing are not used.

In accordance with the teachings of the present disclosure, a memory subsystem includes more than one memory module and one or more communication channels that enable communication with the more than one memory module. The memory subsystem includes a memory controller in communication with the one or more communication channels that are utilized by a processor subsystem to access the more than one memory module. The memory controller executes a memory control utility that enables the IHS to test signal integrity of each line of the one or more communication channels to a memory module. The communication channel has a number of lines that meets or exceeds a specified number of lines required for data and ECC code by the processor subsystem. The memory controller tests the communication channel at a target communication speed. The memory controller determines whether one or more lines of the communication channel fail at the target communication speed due to insufficient signal integrity. The memory controller, in response to determining that the one or more lines fail at the target communication speed, invokes an ECC mode that reassigns lines of the communication channel. Lines that passed signal integrity testing are assigned to carrying data and ECC code. Lines that failed signal integrity testing are not used.

In accordance with the teachings of the present disclosure, an IHS includes at least one processor, more than one memory module, one or more communication channels that address memory locations in the more than one memory module, and a memory controller. The memory controller is in communication with the at least one processor and the one or more communication channels. The memory controller executes a memory control utility that enables the IHS to test signal integrity of each line of the one or more communication channels to a memory module. The communication channel has a number of lines that meets or exceeds a specified number of lines required for data and ECC code by the processor subsystem. The testing is completed at a target communication speed. The memory controller determines whether one or more lines of the communication channel fail at the target communication speed due to insufficient signal integrity. The memory controller, in response to determining that the one or more lines fail at the target communication speed, invokes an ECC mode that reassigns lines of the communication channel. Lines that passed signal integrity testing are assigned to carrying data and ECC code. Lines that failed signal integrity testing are not used.

The above presents a general summary of several aspects of the disclosure in order to provide a basic understanding of at least some aspects of the disclosure. The above summary contains simplifications, generalizations and omissions of detail and is not intended as a comprehensive description of the claimed subject matter but, rather, is intended to provide a brief overview of some of the functionality associated therewith. The summary is not intended to delineate the scope of the claims, and the summary merely presents some concepts of the disclosure in a general form as a prelude to the more detailed description that follows. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

According to aspects of the present innovation, a method, a memory subsystem, and an information handling system (IHS) maintain highest performance of a communication channel that experiences marginal signal integrity. In one or more embodiments, the communication channel is a double data rate fifth-generation (DDR5) communication channel. The memory subsystem of an IHS includes one or more communication channels that enable communication with more than one memory module. A memory controller of the memory subsystem is in communication with the one or more communication channels. In response to determining that one or more lines fail signal integrity testing at a target communication speed, the memory controller invokes an error checking and correcting (ECC) mode that reassigns lines of the communication channel for carrying data and ECC code. Lines that passed signal integrity testing are assigned to carrying data and ECC code. Lines that failed signal integrity testing are not used.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

Figure 1:
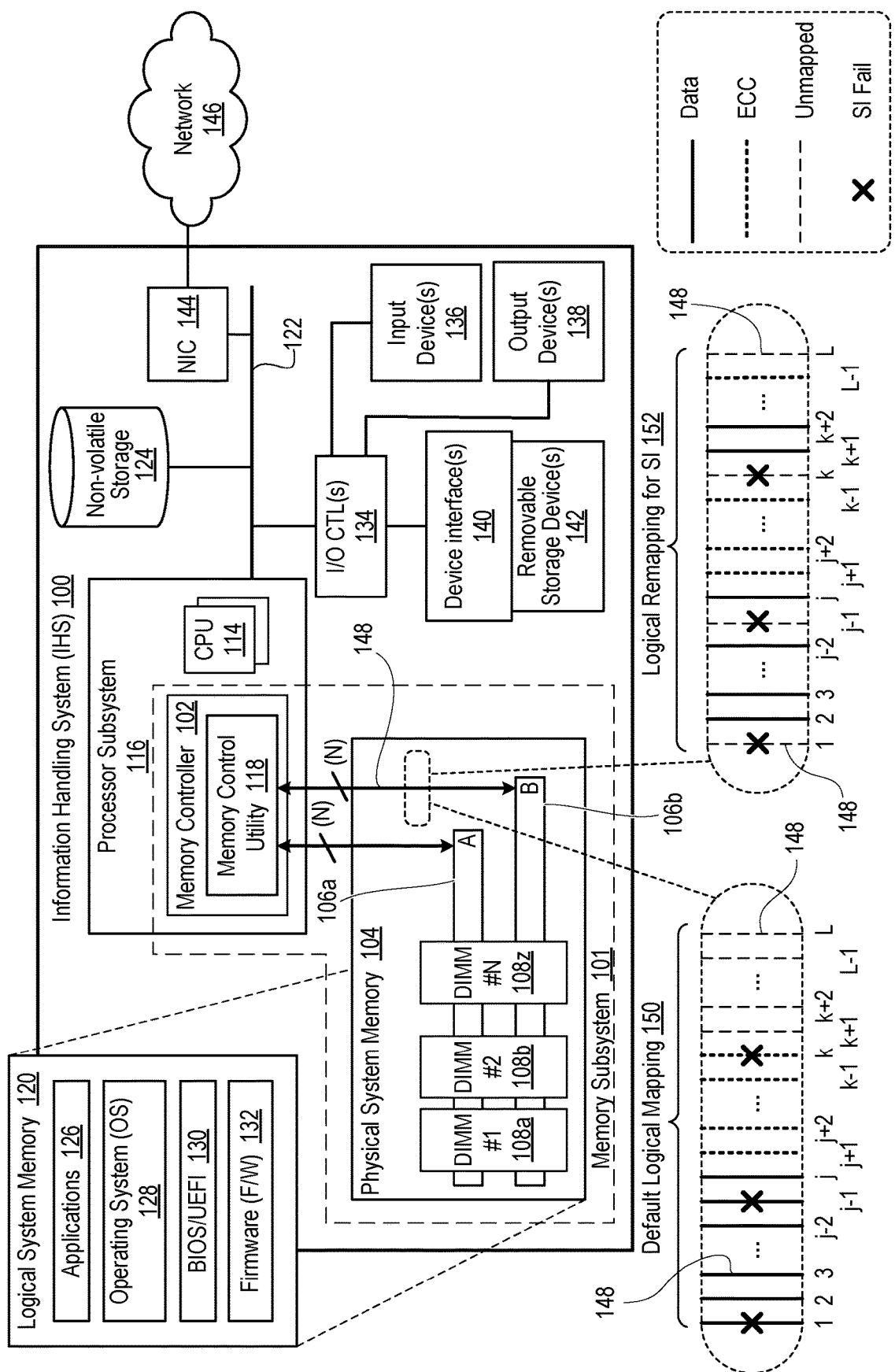
FIG. 1 is block diagram representation illustrating an example information handling system (IHS) having a memory subsystem that mitigates the occurrence of marginal signal integrity (SI) communication lines, according to one or more embodiments.

FIG. 1 illustrates a block diagram representation of an example information handling system (IHS) 100 having a memory subsystem 101 that includes a memory controller 102 that tests and facilitates utilization a physical memory subsystem 104. Memory controller 102 is in communication via one or more communication channels 106a-b to more than one memory module 108a-108z, such as DIMMs. Memory controller 102 is provided along with one or more central processing units (CPUs) 114a-b of a processor subsystem 116. Memory controller 102 executes a memory control utility 118 that enables IHS 100 to maintain a highest performance of a communication channel 106a-b even with an excessive number of lines 148 having marginal signal integrity.

The present innovation recognizes that communication channels 106a-b can have marginal signal integrity due to factors such as manufacturing defects and interference from other components within IHS 100. The occurrence or prevalence of particular lines 148 in communication channels 106a-b that have marginal signal integrity tends to increase with increased communication and transfer speeds. The present innovation provides a mitigation to such marginal signal integrity. In particular, physical system memory 104 is trained during boot time to provide logical system memory 120 during run-time for processor subsystem 116. Dashed lines in FIG. 1 indicate an association between hardware that provides a function that is assigned or arranged according to software as a logical functional layer. Physical system memory 104 includes a number of discrete components that are assigned to contain a portion or an entirety of a logical data structure. Similarly, physical communication channels 106a-b have various communication lines 148 that are logically assigned or reassigned to perform functions for carrying data, EEC code, or are not assigned at all.

For clarity, CPUs 114a-b utilize memory module 108a-108z via memory controller 102. In past implementations, functions of memory control tended to be discrete from CPUs. More recent generations of processor subsystems 116 have more closely integrated memory control with other computing and digital signal processing functions provided by CPUs. Thus, memory controller 102 can be distinct from CPUs 114a b, be fully integrated with CPUs 114a b, or be a distributed function between memory control hardware and CPUs 114a b. In one or more embodiments, a CPU 114a-b can execute memory training, testing, and reassignment functions according to aspects of the present innovation, facilitated by a memory controller 102. For clarity, these functions are referred herein as being performed by memory controller 102.

Within the general context of IHSs, the IHS 100 may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Referring again to FIG. 1, processor subsystem 116 is coupled to functional components via system interconnect 122. System interconnect 122 can be interchangeably referred to as a system bus, in one or more embodiments. Also coupled to system interconnect 122 is non-volatile storage, e.g., a non-volatile random access memory (NVRAM) storage 124, within which can be stored one or more software and/or firmware modules and one or more sets of data that can be utilized during operations of IHS 100. These one or more software and/or firmware modules can be loaded into logical system memory 120 during operation of IHS 100. Specifically, in one embodiment, logical system memory 120 can include therein a plurality of such modules, including one or more of application(s) 126, operating system (OS) 128, basic input/output system (BIOS) or Uniform Extensible Firmware Interface (UEFI) 130, and firmware (F/W) 132. These software and/or firmware modules have varying functionality when their corresponding program code is executed by processor subsystem 116 or secondary processing devices within IHS 100. For example, application(s) 120 may include a word processing application, a presentation application, and a management station application, among other applications.

IHS 100 further includes one or more input/output (I/O) controllers 134 which support connections by and processing of signals from one or more connected input device/s 136, such as a keyboard, mouse, touch screen, or microphone. I/O controllers 134 also support connection to and forwarding of output signals to one or more connected output devices 138, such as a monitor or display device or audio speaker(s). Additionally, in one or more embodiments, one or more device interfaces 140, such as an optical reader, a USB, a card reader, Personal Computer Memory Card International Association (PCMCIA) slot, and/or a high-definition multimedia interface (HDMI), can be associated with IHS 100. Device interface(s) 140 can be utilized to enable data to be read from or stored to corresponding removable storage device(s) 142, such as a compact disk (CD), digital video disk (DVD), flash drive, or flash memory card. In one or more embodiments, device interface(s) 142 can further include general purpose I/O interfaces such as inter-integrated circuit ($I^2C$), system management bus (SMB), and peripheral component interconnect (PCI) buses.

IHS 100 comprises a network interface controller (NIC) 144. NIC 144 enables IHS 100 and/or components within IHS 100 to communicate and/or interface with other devices, services, and components that are located external to IHS 100. These devices, services, and components can interface with IHS 100 via an external network, such as example network 146, using one or more communication protocols that can include transport control protocol/internet protocol (TCP/IP) and network block device (NBD) protocol. Network 146 can be a local area network, wide area network, personal area network, and the like, and the connection to and/or between network and IHS 100 can be wired, wireless, or a combination thereof. For purposes of discussion, network 146 is indicated as a single collective component for simplicity. However, it should be appreciated that network 146 can comprise one or more direct connections to other devices as well as a more complex set of interconnections as can exist within a wide area network, such as the Internet.

Each of the one or more communication channels 106a-b have a predetermined number "N" of communication lines 148 that are tested by memory controller 102 for having sufficient signal integrity (SI). Depending on a communication protocol that is implemented for each of the one or more communication channels 106a b, certain ones of the N communication lines 148 are assigned or mapped to be data lines or ECC lines. Other lines are unused or unmapped. The largest number of communication lines 148 (1 to j inclusive) according to a default logical mapping 150 are assigned for data. Depending upon the amount of error correction specified, a second number of communication lines 148 (j+1 to k) are assigned to ECC coding. Any lines remaining (k+1 to N) are left unused and unmapped. Certain communication lines 148, illustrated in FIG. 1 as 1, j−1, and k, have insufficient signal integrity causing errors. Memory controller 102 provides logical remapping for SI 152 wherein unused communications line 148 (k+1, k+2, and L−1) are remapped from unused respectively to data lines, EEC lines, and unused lines. Communication lines 148 that have failed SI testing (1, j−1, and k) are left unassigned and unmapped.

The present disclosure recognizes challenges and opportunities presented as DDR5 speeds progress from 3200 to 6400+MT/s (Mega-Transfers per second). With increasing speed, the probability drops that all 80 data lines per DDR5 dual in-line memory module (DIMM) are able to maintain highest DDR5 channel frequency with the required enterprise class signal integrity (SI). There are multiple reasons for marginal SI. These reasons include: (i) shorter bit times to capture the data; (ii) higher numbers of DDR channels; and (iii) higher aggregate number of data bits per central processing unit (CPU). For example, 8×80=640 data bit lines/CPU in 2018-2019 is expected to increase to more than 1000 data bit lines per CPU in the mid-2020s. Another reason for marginal SI with increasing communication speed includes: (iv) greater numbers of DIMMs per CPU. For example, a current (2018) enterprise IHS tends to have 16 DIMMs per CPU; however, that number is increasing to 24 DIMMs per CPU by the mid-2020s. More DIMMs per CPU requires additional spacing, and thus resulting longer lengths of communication channels. Long lengths are related to additional reflections and present greater opportunities for susceptibility to interference. Greater overall system density results in greater voltage and switching noise and coupling. The average number of printed circuit board (PCB) layers increases in turn to support the density, which results in greater SI susceptibility, etc. When marginal SI lines are discovered during boot up and training of memory subsystem, generally-known systems are compelled to either: (i) halt entirely; (ii) map out an entire DIMM or channel; or (iii) "down-clock" the DDR speed to one or more bins lower than the optimal speed for safe and robust operation. The down-clocked DDR speed must be applied to all DDR channels in today's enterprise CPU implementations.

Processing cores per CPU are growing at a rate faster than memory bandwidth (BW) per CPU. Even considering that the number of DDR channels per CPU have doubled in the last 5 years, the rate of growth of Processing cores per CPU is still faster. CPU roadmaps for near future growth include CPUs with 48-64 cores per CPU socket. With workload needs of 5-20+GB/s/core, the system is required to run the DDR5 channels at the highest supported speed by both the CPU and DIMMs. Thus, it would be desirable and advantageous to be able to be able to maintain highest DDR frequency even in the presence of one or more data lines per channel that are either unable to run at all at the highest frequency or have inadequate margin at the highest frequency.

Figure 2A:
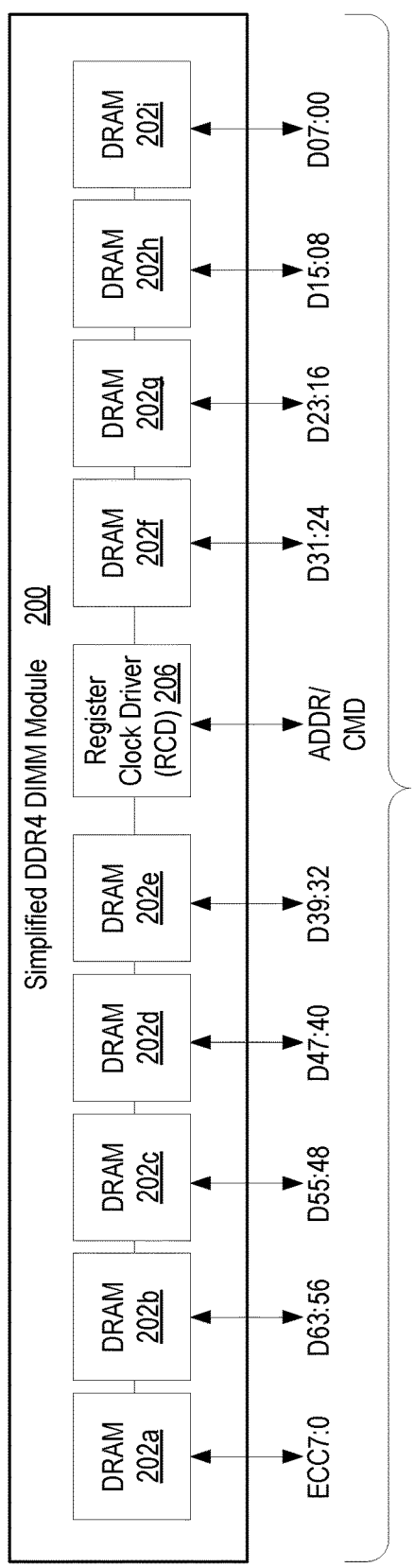
FIG. 2A is a simplified block diagram illustrating a generally-known DIMM module implemented in accordance with fourth-generation double data rate (DDR4) standard.

FIG. 2A is a simplified block diagram illustrating a generally-known DIMM module 200 implemented in accordance with fourth-generation double data rate (DDR4) standard. DIMM module 200 has DRAMs 202a-i that are addressable over a DIMM channel 204. DIMM channel 204 has 72 total data lines of which 64 are for data lines and 8 are for ECC lines. DRAMs 202a-i are supported by a register clock driver (RCD) 206.

Figure 2B:
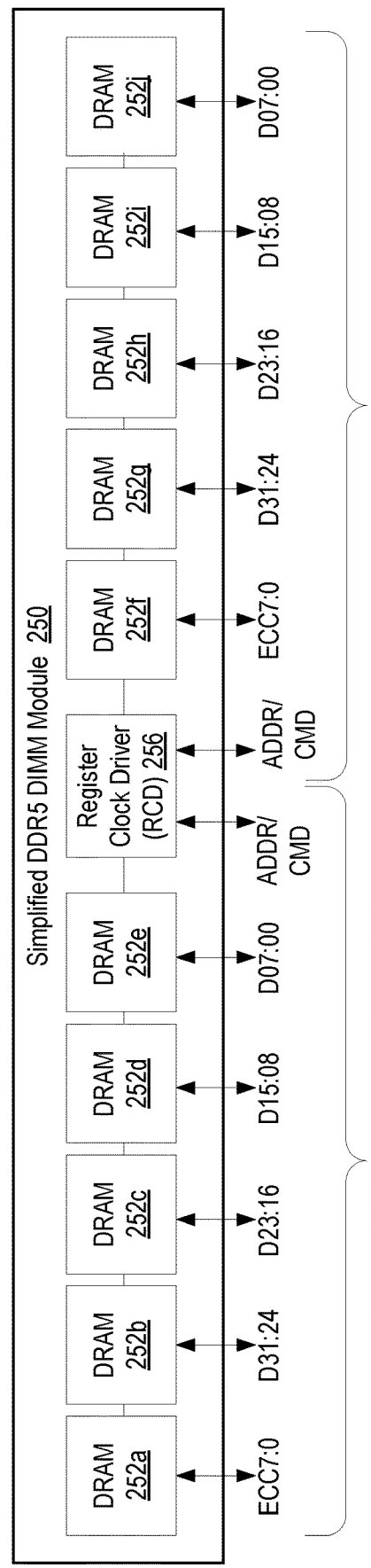
FIG. 2B is a simplified block diagram illustrating a DIMM module implemented in accordance with a proposed fifth-generation double data rate (DDR5) standard, according to one or more embodiments.

FIG. 2B is a simplified block diagram illustrating a DIMM module 250 implemented in accordance with a proposed fifth-generation double data rate (DDR5) standard. DIMM module 250 has DRAMs 252a-j that are addressable over first and second DIMM channels 254a-b that are an example implementation of communication channels 106a-b (FIG. 1). DRAMs 252a-j are supported by RCD 256. Each DIMM channel 254a-b has 40 data bit lines per channel with 32 data bit lines to store data and 8 data bit lines to store ECC code information. ECC code enables host CPU memory controller to be able to provide suitable memory error correction and detection to satisfy memory RAS requirements.

The 8 ECC bits per 32 data lines for each of DIMM channel 254a-b are an increase over what was necessary in DDR2/DDR3/DDR4 which only required eight (8) ECC bits per 64 data lines. The increased number of ECC code lines is driven by multiple factors including a doubling of the DDR5 Burst Length to sixteen (16), which delivers a full 64-byte cache line with only 32 data lines. Four (4) ECC lines per 32 data lines are inadequate to support the memory RAS features equivalent to what is now available on DDR4, such as Single Error Correction Double Error Detection (SECDED), Single Device Data Correction (SDDC, also referred to as "chip kill"), Double Device Data Correction (DDDC), Device Erasure, Column Sparing, etc. The present disclosure contemplates that eight (8) ECC lines per 32 data lines not only support all of the current memory RAS features of DDR4, but there are extra ECC lines and DRAM cell bits that may be used to either support additional RAS features or other functions.

The present disclosure leverages the extra ECC lines and enhanced ECC capability for another purpose. The extra ECC lines provided on DDR5 80-bit DIMM modules 250 and host memory controllers are used to map out marginal SI data lines found during one or more of system boot up, memory margining, and/or run-time. The mapping out can be accomplished by invoking one or more ECC modes available in the host memory controller 102 (FIG. 1) to reassign the data and ECC code lines to avoid problematic data and ECC code line(s). By avoiding use of marginal SI lines, the controller 102 (FIG. 1) can maintain the operation of the DDR5 channels 254a-b at highest possible DDR5 frequency and enterprise class robustness.

The present disclosure provides that a memory controller 102 (FIG. 1): (i) maintains highest performance of a DDR5 channel 254a-b with marginal signal integrity on one or more data lines; (ii) maintains a highest common speed across all DDR channels 254a-b where one or more channels 254a-b would not otherwise operate at the highest speed in the presence of SI marginality; (iii) provides an ability to tradeoff memory ECC mode and strength versus system memory performance within a node via automatic control or via user input preference; (iv) provides an ability to tradeoff memory ECC mode and strength versus system memory performance across a set of nodes that provide multi-node RAS coverage.

TABLE A is a comparison of RAS coverage with and without remapping of lines. A first leftmost column provides a listing of a typical x86 system with advanced memory RAS features. The RAS features are arranged with the least robust mode SECDED is at the top and the most robust X4 DDDC+1 is at the bottom. The most robust RAS feature consumes all of the available ECC lines whereas the less robust RAS features do not require use of all of the ECC lines. A second center column provides the impact to RAS coverage due to mapping the signal and ECC code lines to mitigate a detected line having marginal SI. A third rightmost column provides the impact to RAS coverage due to mapping out an entire nibble of four (4) lines in response to detecting a nibble having marginal SI.

TABLE A

| Standard Memory RAS Mode | New RAS Coverage if mapping out a single data line | New RAS Coverage if mapping out an entire data nibble (4 lines) |
|---|---|---|
| SECDED | SECDEC | SECDED |
| Double Error Correction | Double Error Correction | Double Error Correction |
| X4 SDDC | X4 SDDC | SECDED and/or Double Error Correction |
| X4 SDDC + 1 | X4 SDDC | SECDED and/or Double Error Correction |
| X4 DDDC | X4 SDDC | SECDED and/or Double Error Correction |
| X4 DDDC + 1 | X4 SDDC | SECDED and/or Double Error Correction |

By taking advantage of the "extra" ECC space of unused communication lines 148 (FIG. 1), mapping out a single data line has no impact or only minimal impact to system level DIMM ECC coverage. Even mapping out of an entire 4-bit nibble maintains ECC coverage that is deemed adequate for many enterprise segments and applications. Many other ECC reductions are possible, including dropping down to error detection only, but that option is not usually suitable for enterprise products where SECDED is typically a minimum.

Systems that require highest possible RAS for mission critical workloads usually include system wide RAS coverage at a multi-node level to cover cases in which an entire node may fail. Such configurations include "active-active", "active-passive", clusters, etc. High-performance computer (HPC) clustered systems, sometimes with 100s or 1000s of nodes, typically are designed with minimal RAS requirements per node. HPC clustered systems can handle one or more nodes dropping out during run-time by redeploying spare nodes or other techniques. All of these types of multi-node systems would benefit from running a node at its target speed according to the present innovation. The present disclosure provides a mitigation to occurrences of marginal SI communication lines. The node can be used rather than prompting a drop out from the operational nodes of the HPC clustered system. Keeping the node available increases the robustness of the HPC clustered system.

Figure 3A:
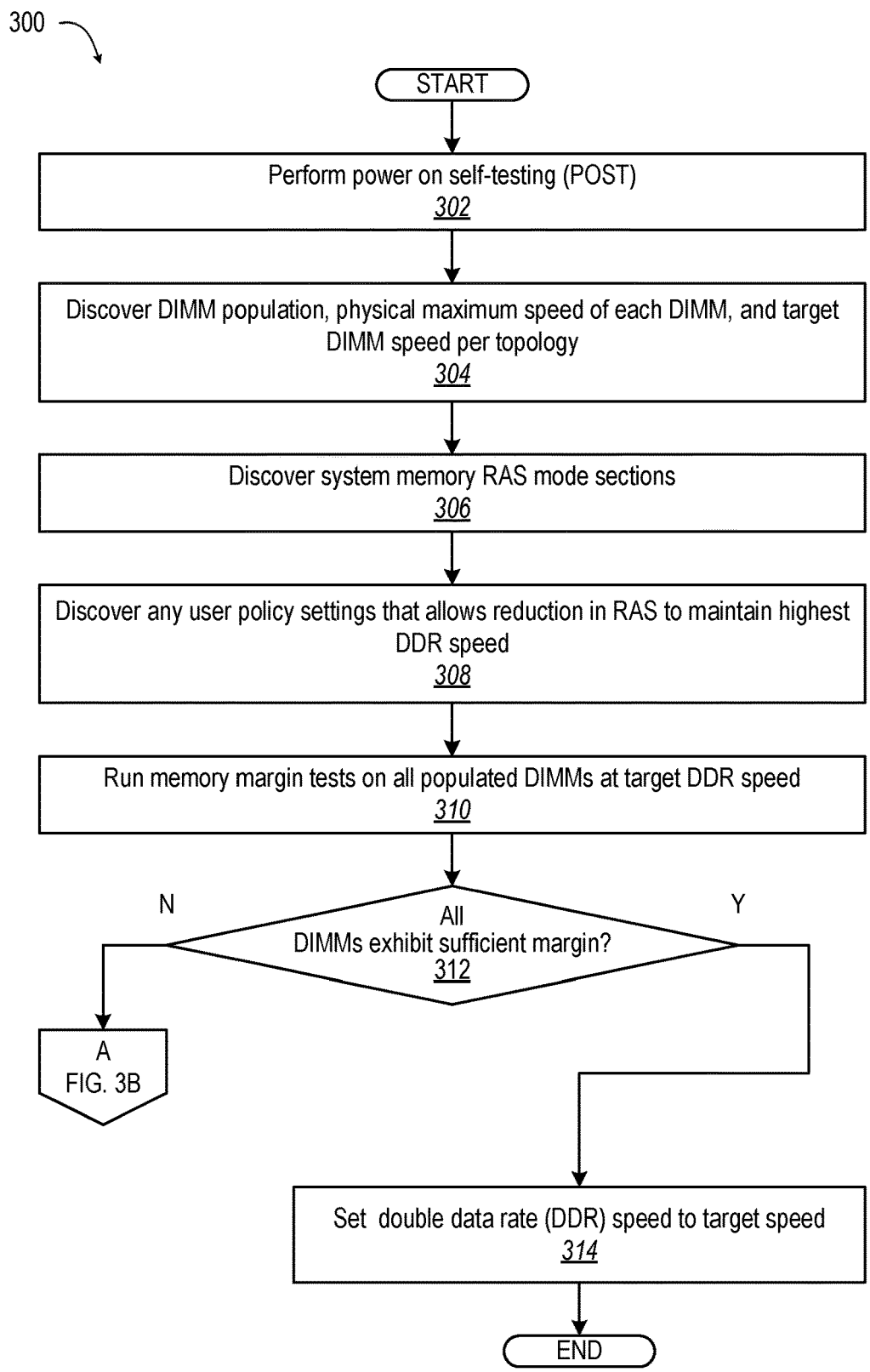
FIGS. 3A-3B are a flow diagram of a method of mitigating the occurrence of marginal SI lines of a memory subsystem of an IHS, according to one or more embodiments.
Figure 3B:
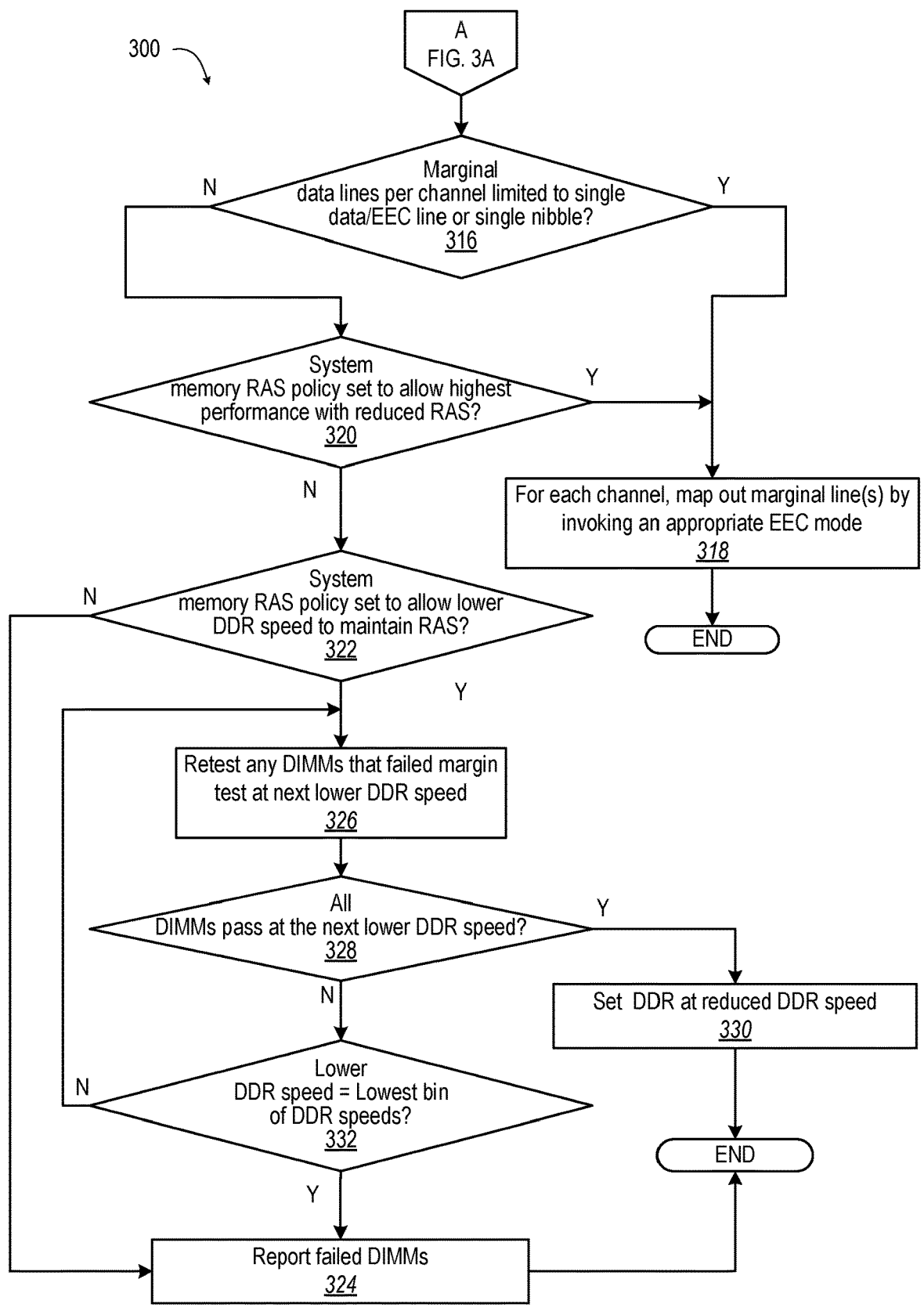

FIGS. 3A-3B are a flow diagram of a method 300 of mitigating marginal SI lines of a memory subsystem of an IHS. As an example, the system tracks run-time memory bit line and nibble errors so that in the next boot, the BIOS may isolate the communication lines having marginal signal integrity that may not be identified during training. Training refers to the discovering and setup of memory resources during the boot procedure. Lines with consistently detectable marginal SI can be mitigated during this process. However, the testing of the communication lines is brief and may not detect certain lines that are intermittently marginal or that are susceptible to transient interference. In one or more embodiments, the system can determine that bit line(s) fail consistently at run-time due to system transients, and hence the system temporarily invokes this feature until the noise dies out. Method 300 begins with the IHS performing power on self-testing (POST) (block 302). Method 300 includes discovering, by the memory controller, DIMM population, physical maximum speed of each DIMM, and target DIMM speed per topology (block 304). System memory RAS mode sections are discovered (block 306). Method 300 includes discovering any user policy setting that allows reduction in RAS to maintain highest DDR speed (block 308).

User policy setting for RAS is generally related to how mission critical the operation of the IHS is. A mission critical system is a system that is essential to the survival of a business or organization. When a mission critical system fails or is interrupted, business operations are significantly impacted. A mission-critical system is also known as mission essential equipment and mission critical application. An operational requirement can be that no error can go uncorrected. Moreover, the operational requirement can further dictate a certain number of simultaneously occurring errors cannot go undetected and uncorrected to avoid a larger system failure. Higher memory RAS coverage capabilities require more ECC code lines.

User policy settings can also dictate whether the memory of the IHS is allowed to operate at a transfer speed that is less than the target speed or not. For example, an IHS can be memory limited to an extent that accommodating DIMMs that can operate at a lower transfer speed is allowable in order to increase available system memory. For another example, the timing of operations of the IHS can require that all DIMMs are capable of transfer speeds at the target communication speed so that simultaneously threaded processes are not impacted. As an additional example, the IHS can be one node of a large number of nodes that need to operate at the same target communication speed in order to operate as a group.

Method 300 further includes running memory margin tests on all populated DIMMs at target DDR speed (block 310). A determination is made as to whether all DIMMs exhibit sufficient margin (decision block 312). In response to determining that that the DIMMS all exhibit sufficient margin, method 300 includes setting double data rate (DDR) speed to target speed (block 314). Then method 300 ends.

In response to determining that that the DENIMS all do not exhibit sufficient margin, method 300 includes determining whether marginal data lines per channel are limited to a single data/ECC line or to a single nibble (decision block 316). In response to determining that marginal data lines per channel are limited to a single data/ECC line or to a single nibble, method 300 includes, for each channel, mapping out marginal line(s) based on mapping (block 320). Then method 300 ends.

In response to determining in decision block 316 that marginal data lines per channel are more than a single data/ECC line or more than a single nibble, a determination is made as to whether memory RAS policy is set to allow highest performance with reduced RAS (decision block 320). In response to determining that memory RAS policy is set to allow highest performance with reduced RAS, method 300 returns to block 318 to invoke an ECC mode that maps out the marginal lines. In response to determining that memory RAS policy is not set to allow highest performance with reduced RAS, a further determination is made as to whether system memory RAS policy is set to allow lower DDR speed to maintain a required level of RAS (decision block 322). In response to determining that system memory RAS policy is set to not allow lower DDR speed to maintain a required level of RAS, method 300 includes reporting DIMMs as failed (block 324). Then method 300 ends.

In response to determining that system memory RAS policy is set to allow lower DDR speed to maintain a required level of RAS, method 300 includes retesting any DIMMs that failed margin test at a next lower DDR speed (block 326). A determination is made as to whether all DIMMs pass at the next lower DDR speed (decision block 328). In response to determining that all DIMMs pass at the next lower DDR speed, method 300 includes setting DDR speed at the reduced DDR speed (block 330). In response to determining that all DIMMs did not pass at the lower DDR speed, a determination is made as to whether the lower DDR speed is the lowest bin of DDR speeds (decision block 332). In response to determining that the lower DDR speed is the lowest bin of DDR speeds, then method 300 proceeds to block 324 to report failed DIMMs. In response to determining that the lower DDR speed is not the lowest bin of DDR, then method 300 proceeds to block 326 to test the next lower bin of DDR speeds.

Figure 4:
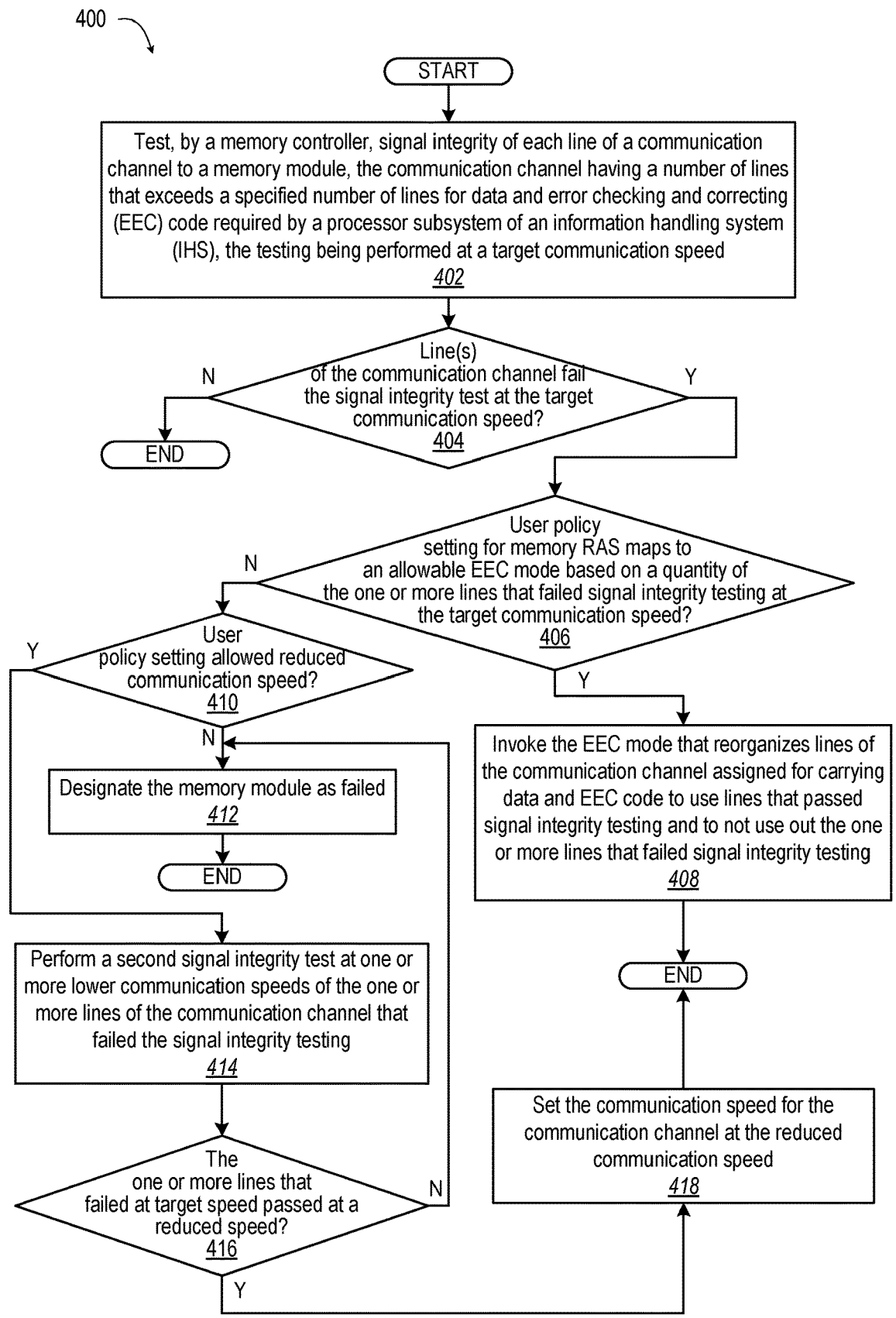
FIG. 4 is a flow diagram of a method of mitigating marginal SI lines during boot time of an IHS, according to one or more embodiments.

FIG. 4 is a flow diagram illustrating a method 400 of mitigating signal integrity issues during boot of an IHS. In one or more embodiments, method 400 includes testing, by a memory controller, signal integrity of each line of a communication channel to a memory module. The communication channel has a number of lines that meets or exceeds a specified number of lines required for data and error checking and correcting (ECC) code by a processor subsystem of an information handling system (IHS). The testing is performed at a target communication speed (block 402). In one or more embodiments, the communication channel is a fifth-generation double data rate (DDR5) communication channel. Method 400 includes determining whether one or more lines of the communication channel fails the signal integrity test at the target communication speed (decision block 404). In response to determining that none of the one or more lines of the communication channel failed the signal integrity tests at the target communication speed, method 400 ends.

In one or more embodiments, method 400 includes determining whether a user policy setting for memory reliability, availability, and serviceability (RAS) maps to an allowable ECC mode based on a quantity of the one or more lines that failed signal integrity testing at the target communication speed (decision block 406). In response to determining that the user policy setting maps to the allowable ECC mode in decision block 406, method 400 includes invoking the ECC mode that reassigns the communication channel (block 408). With the reassignment, lines of the communication channel that passed signal integrity testing are assigned for carrying data and ECC code, and lines of the communication channel that failed signal integrity testing are not used. Then method 400 ends.

In response to determining that the user policy setting does not map to the allowable ECC mode, method 400 includes determining whether the user policy setting allows a reduced communication speed from the target speed (decision block 410). In response to determining that the user policy setting does not allow a reduced communication speed, method 400 includes designating the memory module as failed (block 412). Then method 400 ends. For example, in one or more embodiments, the IHS comprises more than one node that implements RAS across the more than one node rather than at a per node basis. Spare nodes are used instead of any nodes that are unable to operate at the target communication speed. A node that cannot maintain a required level of RAS, such as double error detection, double error correction at the target communication speed is not used.

In response to determining in decision block 410 that the user policy setting does allow a reduced communication speed, method 400 includes performing a second signal integrity test of the one or more lines of the communication channel that failed the signal integrity testing (block 414). The second signal integrity testing is performed at one or more lower communication speeds. A determination is made as to whether the one or more lines passed the second signal integrity testing at a reduced communication speed (decision block 416). In response to determining that the one or more lines did not pass the second signal integrity testing, method 400 returns to block 412 to designate the memory module as failed. In response to determining that the one or more lines did pass the second signal integrity testing at a reduced communication speed, method 400 includes setting the communication speed for the communication channel at the reduced communication speed (block 418). Then method 400 ends.

Figure 5:
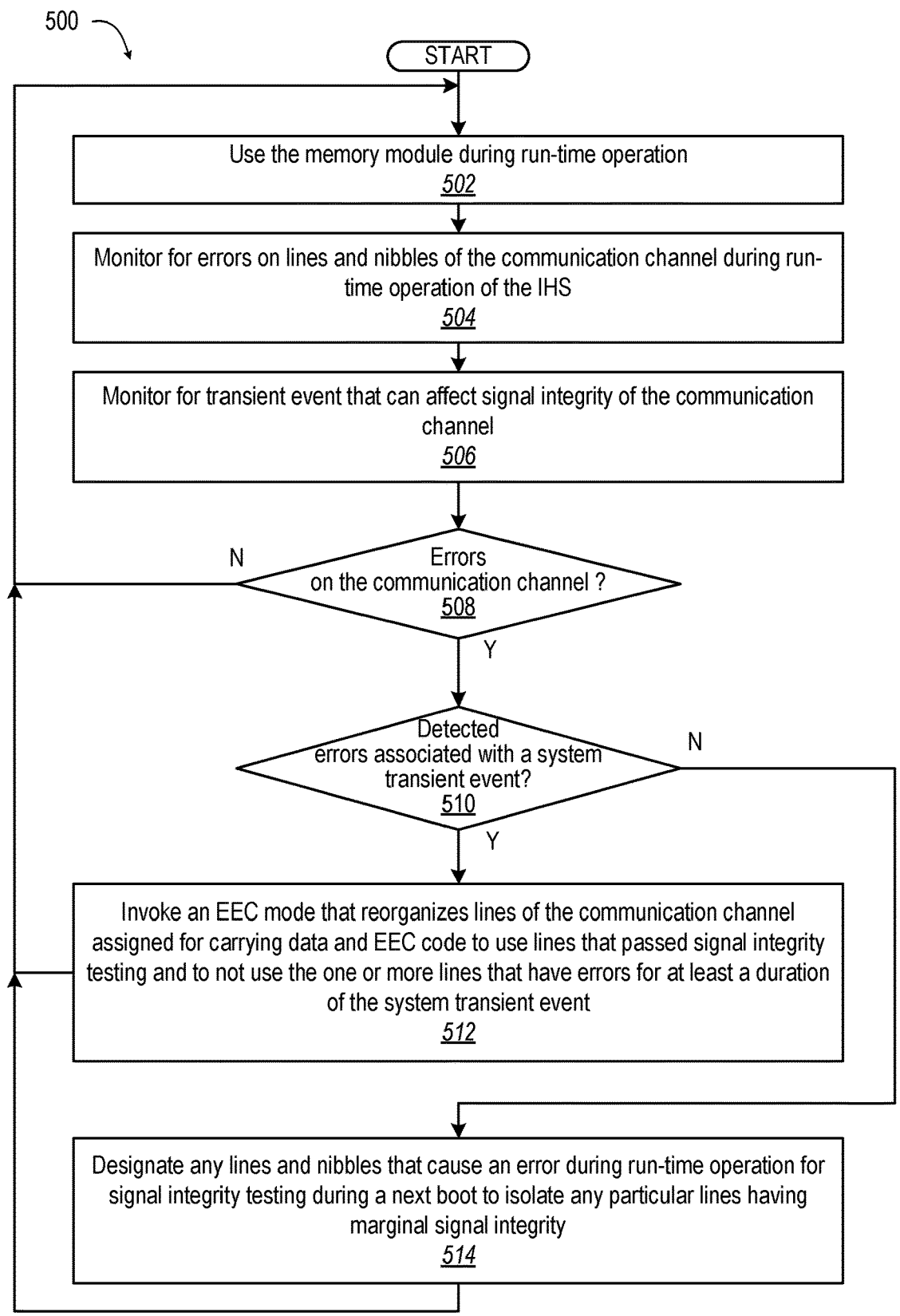
FIG. 5 is a flow diagram of a method of mitigating marginal SI lines during run-time of an IHS, according to one or more embodiments.

FIG. 5 is a flow diagram illustrating a method 500 of mitigating communication channel errors due to insufficient signal integrity during run-time operation. Method 500 begins with processor subsystem using the memory module via the memory controller during run-time operation (block 502). Method 500 includes monitoring by the memory controller for errors on lines and nibbles of the communication channel during run-time operation of the IHS (block 504). Method 500 includes monitoring for transient events that can affect signal integrity of the communication channel (block 506). A determination is made as to whether errors have occurred on the communication channel (decision block 508). In response to determining that errors have not occurred, method 500 returns to block 502 to continue monitoring for errors on the communication channel during run-time operation. In response to determining that errors have occurred, a further determination is made as to whether the detected errors are associated with a system transient event (decision block 510). In response to associating detected errors with a system transient event, method 500 includes invoking an ECC mode that reassigns lines of the communication channel assigned for carrying data and ECC code to use lines that passed signal integrity testing and to not use the one or more lines that have errors for at least a duration of the system transient event (block 512). Then method 500 returns to block 502 to continue monitoring for errors on the communication channel during run-time operation. In response to not associating detected errors with a system transient event, method 500 includes designating any lines and nibbles that cause an error during run-time operation for signal integrity testing during a next boot to isolate any particular lines having marginal signal integrity (block 514). Then method 500 returns to block 502 to continue monitoring for errors on the communication channel during run-time operation.

In the above described flow charts of FIGS. 3A-3B, 4, and 5 one or more of the methods may be embodied in a memory controller that performs a series of functional processes. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

One or more of the embodiments of the disclosure described can be implemented, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A method comprising:
   testing, by a memory controller, signal integrity of each line of a communication channel to a memory module, the communication channel having a number of lines that meets or exceeds a specified number of lines required for data and error checking and correcting (ECC) code by a processor subsystem of an information handling system (IHS), the testing being performed at a target communication speed;
   determining whether one or more lines of the communication channel fails the signal integrity test at the target communication speed;
   in response to determining that one or more lines of the communication channel fails the signal integrity test at the target communication speed, invoking an ECC mode that reassigns lines of the communication channel assigned for carrying data and ECC code to use lines that passed signal integrity testing and to not use the one or more lines that failed signal integrity testing;
   monitoring for errors on lines and nibbles of the communication channel during run-time operation of the IHS; and
   designating any lines and nibbles that cause an error during run-time operation for signal integrity testing during a next boot to isolate any particular lines having marginal signal integrity.

2. The method of claim 1, further comprising:
   determining whether a user policy setting for memory reliability, availability, and serviceability (RAS) maps to an allowable ECC mode based on a quantity of the one or more lines that failed signal integrity testing at the target communication speed;
   in response to determining that the user policy setting maps to the allowable ECC mode, invoking the ECC mode that reassigns lines of the communication channel assigned for carrying data and ECC code to use lines that passed signal integrity testing and to not use out the one or more lines that failed signal integrity testing; and
   in response to determining that the user policy setting does not map to an allowable ECC mode:
      performing a second signal integrity test of the one or more lines of the communication channel that failed the signal integrity testing, the second signal integrity testing performed at one or more lower communication speeds; and
      in response to the one or more lines passing the second signal integrity testing at a reduced communication speed, setting the communication speed for the communication channel to the reduced communication speed.

3. The method of claim 1, wherein the IHS comprises a plurality of nodes including spare nodes, and the IHS implements reliability, availability, and serviceability (RAS) across the plurality of nodes by utilizing the spare nodes instead of any nodes that are unable to operate at the target communication speed.

4. The method of claim 1, further comprising:
   associating detected errors with a system transient event; and
   invoking an ECC mode that reassigns lines of the communication channel assigned for carrying data and ECC code to use lines that passed signal integrity testing and to not use the one or more lines that have errors for at least a duration of the system transient event.

5. The method of claim 1, wherein the communication channel is a fifth-generation double data rate (DDR5) communication channel.

6. A memory subsystem comprising:
   more than one memory module of an information handling system (IHS);
   one or more communication channels that enable communication with the more than one memory module; and
   a memory controller in communication with the one or more communication channels, the memory controller executing a memory control utility that enables the IHS to:
      test signal integrity of each line of the one or more communication channels to a memory module, the communication channel having a number of lines that meets or exceeds a specified number of lines required for data and error checking and correcting (ECC) code by the processor subsystem, the testing being completed at a target communication speed;
      determine whether one or more lines of the communication channel fail at the target communication speed due to insufficient signal integrity;
      in response to determining that one or more lines fail at the target communication speed, invoke an ECC mode that reassigns lines of the communication channel for carrying data and ECC code to use lines that passed signal integrity testing and to not use the one or more lines that failed signal integrity testing;
      monitors for errors on lines and nibbles of the communication channel during run-time operation of the IHS; and
      designate any lines and nibbles that cause an error during run-time operation for signal integrity testing during a next boot to isolate any particular lines having marginal signal integrity.

7. The memory subsystem of claim 6, wherein the memory controller:
   determines whether a user policy setting for memory reliability, availability and serviceability (RAS) maps to an allowable ECC mode based on a quantity of the one or more lines that failed signal integrity testing at the target communication speed;
   in response to determining that the user policy setting maps to the allowable ECC mode, invoke the ECC mode that reassigns lines of the communication channel assigned for carrying data and ECC code to use lines that passed signal integrity testing and to not use the one or more lines that failed signal integrity testing; and in response to determining that the user policy setting does not map to an allowable ECC mode:
  perform a second signal integrity test of the one or more lines of the communication channel that failed the signal integrity testing, the second signal integrity testing performed at one or more lower communication speeds; and
  in response to the one or more lines passing the second signal integrity testing a reduced communication speed, sets the communication speed for the communication channel to the reduced communication speed.

8. The memory subsystem of claim 6, wherein the IHS comprises a plurality of nodes including spare nodes, and the IHS implements reliability, availability, and serviceability (RAS) across the plurality of nodes by utilizing the spare nodes instead of any nodes that are unable to operate at the target communication speed.

9. The memory subsystem of claim 6, wherein the memory controller:
associates detected errors with a system transient event; and
invoking an ECC mode that reassigns lines of the communication channel assigned for carrying data and ECC code to use lines that passed signal integrity testing and to not use the one or more lines that have errors for at least a duration of the system transient event.

10. The memory subsystem of claim 6, wherein the communication channel is a fifth-generation double data rate (DDR5) communication channel.

11. An information handling system (IHS) comprising:
at least one processor;
more than one memory module;
one or more communication channels that address memory locations in the more than one memory module; and
a memory controller in communication with the at least one processor and the one or more communication channels, the memory controller executing a memory control utility that enables the IHS to:
  test signal integrity of each line of the one or more communication channels to a memory module, the communication channel having a number of lines that meets or exceeds a specified number of lines required for data and error checking and correcting (ECC) code by the processor subsystem, the testing being completed at a target communication speed;
  determine whether one or more lines of the communication channel fail at the target communication speed due to insufficient signal integrity;
  in response to determining that one or more lines fail at the target communication speed, invoke an ECC mode that reassigns lines of the communication channel assigned for carrying data and ECC code to use lines that passed signal integrity testing and to not use the one or more lines that failed signal integrity testing;
  monitors for errors on lines and nibbles of the communication channel during run-time operation of the IHS; and
  designate any lines and nibbles that cause an error during run-time operation for signal integrity testing during a next boot to isolate any particular lines having marginal signal integrity.

12. The IHS of claim 11, wherein the memory controller:
determines whether a user policy setting for memory reliability, availability and serviceability (RAS) maps to an allowable ECC mode based on a quantity of the one or more lines that failed signal integrity testing at the target communication speed;
in response to determining that the user policy setting maps to the allowable ECC mode, invoke the ECC mode that reassigns lines of the communication channel assigned for carrying data and ECC code to use lines that passed signal integrity testing and to not use the one or more lines that failed signal integrity testing; and
in response to determining that the user policy setting does not map to an allowable ECC mode:
  perform a second signal integrity test of the one or more lines of the communication channel that failed the signal integrity testing, the second signal integrity testing performed at one or more lower communication speeds; and
  in response to the one or more lines passing the second signal integrity testing a reduced communication speed, sets the communication speed for the communication channel at the reduced communication speed.

13. The IHS of claim 11, further comprising a plurality of nodes including spare nodes, and the IHS implements reliability, availability, and serviceability (RAS) across the plurality of nodes by utilizing the spare nodes instead of any nodes that are unable to operate at the target communication speed.

14. The IHS of claim 11, wherein the memory controller:
associates detected errors with a system transient event; and
invoking an ECC mode that reassigns lines of the communication channel assigned for carrying data and ECC code to use lines that passed signal integrity testing and to not use the one or more lines that have errors for at least a duration of the system transient event.

15. The IHS of claim 11, wherein the communication channel is a fifth-generation double data rate (DDR5) communication channel.

* * * * *